US012787709B2

(12) United States Patent
Yoon et al.

(10) Patent No.: US 12,787,709 B2
(45) Date of Patent: Nov. 3, 2026

(54) ADHESIVE SHEET FOR SEMICONDUCTOR DEVICE

(71) Applicant: INNOX Advanced Materials Co., Ltd., Asan-si (KR)

(72) Inventors: Keun-Young Yoon, Asan-si (KR); Young-Gun Kim, Asan-si (KR); Yeong-Seok Cho, Asan-si (KR); Duck-Soo Kim, Asan-si (KR); Do-Woo Ki, Asan-si (KR)

(73) Assignee: INNOX Advanced Materials Co., Ltd., Asan-si (KR)

( * ) Notice: Subject to any disclaimer, the term of this patent is extended or adjusted under 35 U.S.C. 154(b) by 144 days.

(21) Appl. No.: 19/004,189

(22) Filed: Dec. 27, 2024

(65) Prior Publication Data

US 2025/0218851 A1 Jul. 3, 2025

(30) Foreign Application Priority Data

Dec. 29, 2023 (KR) ........................ 10-2023-0197658

(51) Int. Cl.
*H10P 72/70* (2026.01)

(52) U.S. Cl.
CPC ...... *H10P 72/7402* (2026.01); *H10P 72/7412* (2026.01); *H10P 72/7416* (2026.01)

(58) Field of Classification Search
CPC ............. H10P 72/7402; H10P 72/7412; H10P 72/7416
See application file for complete search history.

(56) References Cited

U.S. PATENT DOCUMENTS

2014/0205816 A1 7/2014 Maejima

FOREIGN PATENT DOCUMENTS

| | | | |
|---|---|---|---|
| JP | 2006-202927 | | 8/2006 |
| JP | 2007-002173 | | 1/2007 |
| JP | 2009-231382 | A | 10/2009 |
| JP | 2010-045181 | | 2/2010 |
| JP | 2010-287848 | A | 12/2010 |
| KR | 10-2013-0062817 | | 6/2013 |
| TW | 201309772 | A | 3/2013 |
| TW | 201532154 | A | 8/2015 |
| TW | 201714996 | A | 5/2017 |
| TW | 202035604 | A | 10/2020 |

OTHER PUBLICATIONS

Taiwanese Office Action dated Aug. 4, 2025 issued in Taiwan Patent Application No. 113151165.
Taiwanese Office Action dated Dec. 9, 2025 issued in Taiwan Patent Application No. 113151165.
Written Decision on Registration dated Aug. 6, 2026, issued in Korean Patent Application No. 10-2023-0197658.

*Primary Examiner* — Lawrence D Ferguson
(74) *Attorney, Agent, or Firm* — PnK IP LLC

(57) ABSTRACT

An adhesive sheet for a semiconductor device includes a dicing tape integrated backside protective film disposed at predetermined intervals in a longitudinal direction of a separator, and a support film disposed to be spaced apart from the outside of the dicing tape integrated backside protective film to include both long sides of the separator, in which the support film includes an adhesive layer in contact with the separator and a second dicing tape formed on the adhesive layer, and the second dicing tape protrudes toward the dicing tape integrated backside protective film more than the adhesive layer of the support film.

8 Claims, 1 Drawing Sheet

ADHESIVE SHEET FOR SEMICONDUCTOR DEVICE

CROSS REFERENCE TO RELATED APPLICATION

This application claims priority from and the benefit of Korean Patent Application No. 10-2023-0197658, filed on Dec. 29, 2023, which is hereby incorporated by reference for all purposes as if fully set forth herein.

BACKGROUND

Field

Embodiments of the invention relate generally to an adhesive sheet for a semiconductor device, and more specifically, to an adhesive sheet for a semiconductor device capable of suppressing the occurrence of winding wrinkles when wound in the form of a roll.

Discussion of the Background

Manufacturing of semiconductor devices is performed by reforming a wafer into chips and bonding the chips to a substrate or the like. In such manufacturing of the semiconductor device, dicing tapes that support chips and die attachment films (DAFs) for bonding the chips are used when a wafer is reformed into the chips. In addition, a dicing tape integrated backside protective film, which combines a function of the dicing tape with a function of the DAF, has recently been used. Specifically, in the dicing tape integrated backside protective film, a DAF is stacked on a separator and at the same time, a dicing tape is stacked on the DAF. In addition, to attach the dicing tape to a wafer ring frame used for dicing, the dicing tape is formed larger than the DAF to cover the DAF.

One or more such dicing tape integrated backside protective films may be attached to be spaced apart at a predetermined interval in a longitudinal direction of the separator. In addition, the separator including the dicing tape integrated backside protective film is wound in the form of a roll to be stored and transported.

Meanwhile, due to a difference between a height of the dicing tape in a middle portion of the separator with a DAF and a height of the dicing tape of an edge part without the DAF, there is a problem that wrinkles occur in an adhesive sheet for a semiconductor device. Therefore, it is necessary to suppress the occurrence of wrinkles when such an adhesive sheet is wound in the form of a roll.

The above information disclosed in this Background section is only for understanding of the background of the inventive concepts, and, therefore, it may contain information that does not constitute prior art.

SUMMARY

Embodiments of the invention are directed to providing an adhesive sheet for a semiconductor device, which is capable of suppressing the occurrence of wrinkles when wound.

Embodiments of the invention are also directed to providing an adhesive sheet for a semiconductor device, which does not cause problems such as scattering of foreign substances, degradation of workability, etc. while suppressing the occurrence of wrinkles.

Additional features of the inventive concepts will be set forth in the description which follows, and in part will be apparent from the description, or may be learned by practice of the inventive concepts An adhesive sheet for a semiconductor device according to an embodiment includes a separator, a dicing tape integrated backside protective film disposed at predetermined intervals in a longitudinal direction of the separator, and a support film disposed to be spaced apart from the outside of the dicing tape integrated backside protective film to include both long sides of the separator, in which a thickness of the support film is equal to a thickness of a portion of the dicing tape integrated backside protective film including an adhesive layer. The support film includes a second adhesive layer in contact with the separator and a second dicing tape formed on the second adhesive layer, and the second dicing tape protrudes toward the dicing tape integrated backside protective film more than the second adhesive layer.

A width of the second adhesive layer toward the dicing tape integrated backside protective film may be smaller than a width of the second dicing tape toward the dicing tape integrated backside protective film.

The dicing tape integrated backside protective film may include a first adhesive layer in contact with the separator and a first dicing tape formed on the first adhesive layer, and the second adhesive layer of the support film may be the same as the first adhesive layer of the dicing tape integrated backside protective film.

The dicing tape integrated backside protective film may include a first adhesive layer in contact with the separator and a first dicing tape formed on the first adhesive layer, and the second dicing tape of the support film may be the same as the first dicing tape of the dicing tape integrated backside protective film.

The second dicing tape of the support film may include a second PSA layer and a base layer formed on the second PSA layer, and the second PSA layer may be formed on the second adhesive layer.

The support film may be disposed in a direction that surrounds a portion or the entire outer perimeter of the dicing tape integrated backside protective film.

The adhesive sheet may include one or more unit bodies including the dicing tape integrated backside protective film and the support film on one surface of the separator.

The adhesive sheet for a semiconductor device may be wound in the form of a roll.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
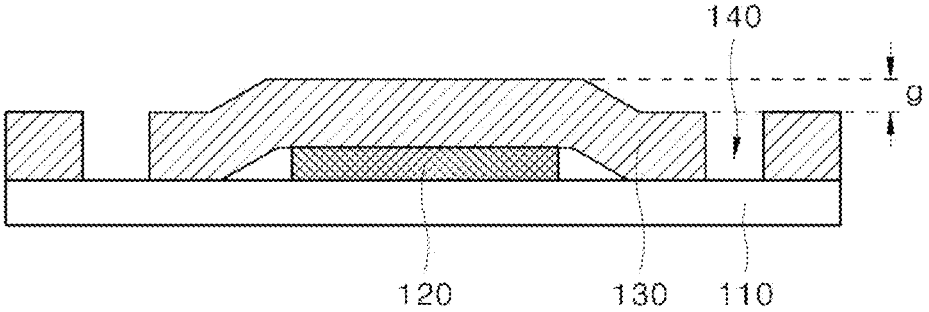
FIG. 1 (PRIOR ART)
FIG. 1 schematically shows a structure of a conventional adhesive sheet for a semiconductor device.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 shows an adhesive sheet for a semiconductor device including a conventional dicing tape integrated backside protective film that is pre-cut according to a shape of a semiconductor element. Referring to FIG. 1, a dicing tape integrated backside protective film, to which a die attachment film 120 (first adhesive layer) and a dicing tape 130 that covers the die attachment film 120 are coupled, is attached to a separator 110. Although FIG. 1 shows a single dicing tape integrated backside protective film, one or more dicing tape integrated backside protective films attached at regular intervals in a longitudinal direction of a separator may be actually included. In addition, the dicing tape integrated backside protective film includes a support film disposed to be spaced apart from the outside of the dicing tape integrated backside protective film to include both long sides of the separator 110.

As shown in FIG. 1, the dicing tape integrated backside protective film has a step at a boundary between a portion where the die attachment film 120 and the dicing tape 130 are stacked on the separator 110 and a portion where only the dicing tape 130 is stacked on the separator 110 due to a height difference g therebetween.

Therefore, when the dicing tape integrated backside protective film is wound in the form of a roll, the step is transferred to the die attachment film 120 and the dicing tape 130, resulting in a transfer trace of the step on the die attachment film 120 and the dicing tape 130. In particular, when the transfer trace is formed on the die attachment film 120, voids may be generated between semiconductor wafers, thereby reducing the reliability of the semiconductor device.

An adhesive sheet for a semiconductor device according to an embodiment includes a separator, a dicing tape integrated backside protective film disposed at predetermined intervals in the longitudinal direction of the separator, and a support film disposed to be spaced apart from the outside of the dicing tape integrated backside protective film to include both long sides of the separator. A thickness of the support film is equal to a thickness of a portion of the dicing tape integrated backside protective film including an adhesive layer. The support film includes a second adhesive layer in contact with the separator and a second dicing tape formed on the second adhesive layer, and the second dicing tape protrudes toward the dicing tape integrated backside protective film more than the second adhesive layer. In this manner, it is possible to suppress the occurrence of wrinkles due to transfer even when the adhesive sheet for a semiconductor device is wound in the form of a roll. In addition, it is possible to prevent the occurrence of problems such as scattering of foreign substances, which will be described in more detail below.

Figure 2:
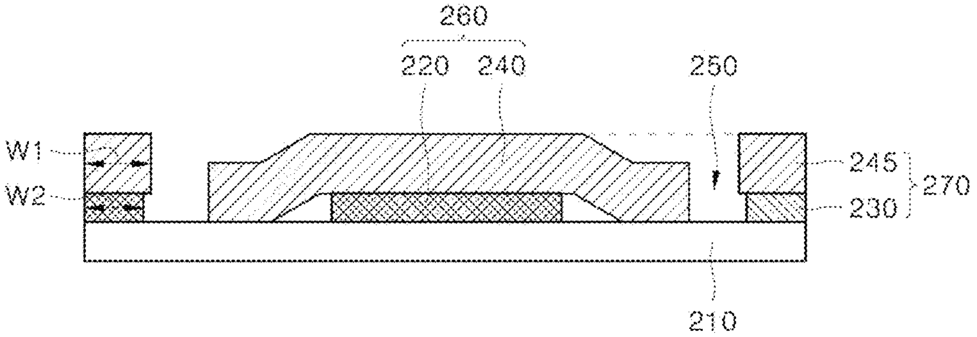
FIG. 2 schematically shows a structure of an adhesive sheet for a semiconductor device according to an embodiment.

FIG. 2 schematically shows a structure of an adhesive sheet for a semiconductor device according to an embodiment.

Referring to FIG. 2, an adhesive sheet for a semiconductor device according to an embodiment includes a dicing tape integrated backside protective film 260 including a first adhesive layer 220 and a first dicing tape 240 on a separator 210, and a support film 270 disposed to be spaced apart from the outside of the dicing tape integrated backside protective film 260 to include both long sides of the separator 210.

The first adhesive layer 220 is a layer that comes into contact with the separator 210 and functions as a die attachment film (DAF). That is, the first adhesive layer 220 is attached to a wafer to fixedly adhere chips reformed by dicing. Therefore, the first adhesive layer 220 may have a circular thin film shape. A composition of an adhesive included in the first adhesive layer 220 is not particularly limited as long as it is a composition used for the DAF and may be, for example, an epoxy resin, an acrylic resin, a phenol resin, a polyimide resin, a silicon resin, etc.

The first adhesive layer 220 may be in a B-stage state. The "B-stage" is a semi-cured state, specifically, an intermediate state during a curing reaction process of a material.

The first adhesive layer 220 may have an average thickness of about 3 μm to 60 μm, but is not necessarily limited thereto. In some embodiments, the first adhesive layer 220 may have an appropriate thickness depending on a device to which the first adhesive layer 220 is to be applied.

The first dicing tape 240 functions to support the wafer during dicing and at the same time, fixedly adhere a wafer ring. The first dicing tape 240 may be formed on the first adhesive layer 220 and may be stacked in a circular thin film shape that has a larger area than the first adhesive layer 220 to cover the first adhesive layer 220. Therefore, a front surface of the first adhesive layer 220 is attached to the separator 210, and an edge part of the first dicing tape 240 is attached to the separator 210 to surround the entire outer perimeter of the first adhesive layer 220.

Before UV curing of the first dicing tape 240, high adhesive strength with the first adhesive layer 220 of the first dicing tape 240 is maintained. However, after the UV curing of the first dicing tape 240 which greatly weakens adhesive strength thereof, the first adhesive layer 220 needs to be easily peeled from the first dicing tape 240. Although not particularly limited, a conventionally known dicing tape may be used. The first dicing tape 240 may include a first pressure sensitive adhesive (PSA) layer and a base layer formed on the first PSA layer. The first PSA layer may be formed on the first adhesive layer 220. As an adhesive included in the PSA layer included in the first dicing tape 240, for example, a chlorinated polypropylene resin, an acrylic resin, a polyester resin, a polyurethane resin, an epoxy resin, a polyethylene, polypropylene, an ethylene-propylene copolymer, a polybutene-1, a poly-4-methylpentene-1, an ethylene-vinyl acetate copolymer, an ethylene-acrylate copolymer, an ethylene-methyl acrylate copolymer, an ethylene-acrylate copolymer, an ionomer, a styrene-ethylene-butene or a pentene-based copolymer, a polyamide-polyol copolymer, or a mixture thereof may be used.

The dicing tape integrated backside protective film 260 includes the first adhesive layer 220 and the first dicing tape 240 stacked on the first adhesive layer 220, and the dicing tape integrated backside protection film 260 is disposed at predetermined intervals in the longitudinal direction of the separator.

The support film 270 is formed by being pre-cut in a pre-cut part 250 according to a shape of the semiconductor element and is disposed to be spaced apart from the outside of the dicing tape integrated backside protective film 260. The support film 270 may have a thickness that is equal to a thickness of a portion of the dicing tape integrated backside protective film 260 including the adhesive layer and remove a step due to a height difference between the first dicing tape 240 and a second dicing tape 245. Therefore, when the adhesive sheet for a semiconductor device is wound in the form of a roll, it is possible to suppress the occurrence of wrinkles when the dicing tape integrated backside protective film 260 is wound.

The support film 270 may be disposed in a direction that surrounds a portion or the entire outer perimeter of the dicing tape integrated backside protective film 260. Specifically, the support film 270 may be formed to be spaced apart from the outside of the dicing tape integrated backside protective film 260 to surround the periphery of a portion other than a middle portion of the separator 210 in a width direction. The support film 270 may be disposed to include both long sides of the separator 210. In addition, the support film 270 may extend continuously or intermittently in the longitudinal (long side) direction of the separator 210. In addition, the support film 270 may be composed of a plurality of segments that surround a portion of the dicing tape integrated backside protective film 260. As another example, the support film 270 may be composed of a single segment that surrounds the entirety of the dicing tape integrated backside protective film 260.

The support film 270 includes a second adhesive layer 230 in contact with the separator 210. The second adhesive layer 230 of the support film 270 may be formed together when the first adhesive layer 220 of the discing tape integrated backside protective film 260 is formed. Therefore, the second adhesive layer 230 of the support film 270 may be the same as the first adhesive layer 220 of the dicing tape integrated backside protective film 260. The second adhesive layer 230 may have the same material and thickness as the first adhesive layer 220. The second adhesive layer 230 may be in a B-stage state.

In addition, the support film 270 includes the second dicing tape 245 formed on the second adhesive layer 230. The second dicing tape 245 of the support film 270 may be formed together when the first dicing tape 240 of the dicing tape integrated backside protective film 260 is formed. Therefore, the second dicing tape 245 of the support film 270 may be the same as the first dicing tape 240 of the dicing tape integrated backside protective film 260. Therefore, the second dicing tape 245 may have the same material and thickness as the first dicing tape 240.

In this manner, since the second adhesive layer 230 and the second dicing tape 245 of the support film 260 are the same as the first adhesive layer 220 and the first dicing tape 240 of the dicing tape integrated backside protective film 260, respectively, and do not require a separate material or process to form the support film 270, an adhesive sheet for a semiconductor device can be formed more economically and efficiently.

The second dicing tape 245 of the support film 270 may include a second PSA layer and a base layer formed on the second PSA layer, and the second PSA layer may be formed on the second adhesive layer 230. The second PSA layer and the base layer may be the same as the first PSA layer and the base layer of the dicing tape integrated backside protective film 260.

When viewed from the side of the adhesive sheet for a semiconductor device, the second dicing tape 245 of the support film 270 protrudes toward the dicing tape integrated backside protective film 260 more than the second adhesive layer 230. When the second adhesive layer 230 is formed of the same material as the first adhesive layer 220 of the dicing tape integrated backside protective film, 260 a problem that the first and second adhesive layers 220 and 230 are broken by a pressure or impact while cutting or storing or moving in a wound state due to the brittle properties of the first and second adhesive layers 220 and 230 and shatter while foreign substances are formed may occur. The adhesive sheet for a semiconductor device can protect the second adhesive layer 230 by having a structure in which the second dicing tape 245 protrudes toward the dicing tape integrated backside protective film 260 more than the second adhesive layer 230, thereby preventing the occurrence of the above problem.

A width W2 of the second adhesive layer 230 toward the dicing tape integrated backside protective film 260 may be smaller than a width W1 of the second dicing tape 245 toward the dicing tape integrated backside protective film 260.

The second adhesive layer 230 preferably supports the second dicing tape 245. To this end, the second adhesive layer 230 preferably has a predetermined width. When an outer edge of the second adhesive layer 230 matches an outer edge of the second dicing tape 245, a ratio (W2/W1) of the width W2 of the second adhesive layer 230 to the width W1 of the second dicing tape 245 may be in the range of 0.2 or more and less than 1.0. More preferably, the ratio (W2/W1) may be in the range of 0.3 or more and 0.8 or less.

The separator 210 is intended to adhere, support, and wind the dicing tape integrated backside protective film 260. The separator 210 is not particularly limited, but may be formed of a base film such as a polyester film, a polypropylene film, a polyethylene terephthalate film, a polyimide film, a polyetherimide film, a polyethernaphthalate film, or a polymethylpentene film.

Although FIG. 2 shows only a single unit body including the dicing tape integrated backside protective film 260 and the support film 270 on one surface of the separator 210, the adhesive sheet for a semiconductor device may include one or more unit bodies including the dicing tape integrated backside protective film and the support film on one surface of the separator.

The adhesive sheet for a semiconductor device may be wound in the form of a roll and stored and transported. Since the adhesive sheet for a semiconductor device has the above-described characteristics, it is possible to remove a difference between a height of the first dicing tape 240 of the middle portion of the dicing tape integrated backside protective film 260 in which the first adhesive layer 220 is present and a height of the support film 270, thereby suppressing the occurrence of wrinkles even when the adhesive sheet is wound in the form of a roll. In addition, since the second adhesive layer 230 and the second dicing tape 245 of the support film 270 are the same as the first adhesive layer 220 and the first dicing tape 240 of the dicing tape integrated backside protective film 260, respectively, and do not require a separate material or process to form the support film 270, the adhesive sheet for a semiconductor device can be formed more economically and efficiently.

In addition, since the second dicing tape 245 has a structure that protrudes toward the dicing tape integrated backside protective film 260 more than the second adhesive layer 230, it is possible to prevent the occurrence of problems such as generation, shattering of foreign substances, etc.

EXAMPLES

Hereinafter, the configuration and operation of the inventive concepts will be described in more detail through exemplary embodiments. However, this is suggested as preferred examples and may not be construed as limiting the inventive concepts in any sense.

Example 1

The adhesive sheet for a semiconductor device of FIG. 2 was manufactured by a punching process after laminating a first adhesive film 220 (Innox Advanced Materials Co., Ltd.) on a separator (PET) film and laminating a first dicing tape 240 (Innox Advanced Materials Co., Ltd.) on the first adhesive film 220. Therefore, a second adhesive layer 230 of a support film 270 had the same material and thickness as the first adhesive film 220, and a second dicing film 245 had the same material and thickness as the first dicing film 240.

In this case, a width W1 of the second dicing tape 245 was 6.5 mm and a width W2 of the second adhesive layer 230 was 3 mm in the support film 270.

In addition, the manufactured adhesive sheets were wound using a winder.

Example 2 and Comparative Examples 1 and 2

An adhesive sheet for a semiconductor device was manufactured in the same method as in Example 1 except that the width W2 of the second adhesive layer that forms the support film is changed to various values as shown in Table 1 in Example 1.

In addition, the manufactured adhesive sheets were wound using a winder.

Evaluation

Whether wrinkles occurred and whether foreign substances shattered were evaluated after storing the wound adhesive sheets at room temperature and freezing temperature (−10° C.) for one day, and the result of the evaluation is shown in Table 1.

Whether wrinkles occurred was evaluated by visually inspecting a product surface after the adhesive sheet was wound and stored at the freezing temperature for one day.

Whether foreign substances shattered was evaluated by visually inspecting an edge part of the punched product.

The width W1 of the second dicing tape 245 and the width W2 of the second adhesive layer 230 in Table 1 are the widths shown in FIG. 2. An outer edge of the second dicing tape 245 matches an outer edge of the second adhesive layer 230.

TABLE 1

| Items | | Example 1 | Example 2 | Comparative Example 1 | Comparative Example 2 |
|---|---|---|---|---|---|
| Width (mm) | W1 | | 6.5 | | |
| | W2 | 3 | 2 | 0 | 6.5 |
| Ratio of widths | W1/W2 | 0.46 | 0.31 | 0 | 1.00 |
| Winding wrinkles | Stored at room temperature | Non-occurred | Non-occurred | Occurred | Non-occurred |
| | Stored at freezing temperature | Non-occurred | Non-occurred | Occurred | Non-occurred |
| Foreign substance shattering of second adhesive layer | | X | X | X | Occurred |

Referring to Table 1, in the cases of Examples 1 and 2 in which the second dicing tape 245 protrudes toward the first adhesive layer 220 because the width W1 of the second dicing tape 245 is larger than the width W2 of the second adhesive layer 230, winding wrinkles did not occur and foreign substance shattering of the second adhesive layer 230 did not occur when the adhesive sheet was stored at both the room temperature and freezing temperature.

On the other hand, in the case of Comparative Example 1 in which the second adhesive layer was not disposed, winding wrinkles occurred when the adhesive sheet was stored at both room temperature and freezing temperature. Meanwhile, in the case of Comparative Example 2 in which the width of the second adhesive layer was equal to the width of the second dicing tape, winding wrinkles did not occur, but foreign substance shattering of the second adhesive layer occurred.

Therefore, it can be concluded that it is most preferable that the second dicing tape 245 protrudes toward the first adhesive layer 220 while the second dicing tape 245 is stably supported on the second adhesive layer 230.

According to the adhesive sheet for a semiconductor device according to embodiments, it is possible to reduce or remove the difference between the height of the dicing tape integrated backside protective film in the middle portion with the first adhesive layer and the height of the edge part without the first adhesive layer. Therefore, it is possible to suppress the occurrence of wrinkles even when the adhesive sheet is wound in the form of a roll.

In addition, since the adhesive sheet includes the support film for compensating for a thickness using the dicing tape integrated backside protective film, it is possible to perform the process more economically and efficiently.

In addition, it is possible to prevent the occurrence of problems such as scattering of foreign substances, etc. by adjusting the structure of the support film even when the support film includes the same material as the first adhesive layer of the dicing tape integrated backside protective film.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An adhesive sheet for a semiconductor device, comprising:

a separator;

a dicing tape integrated backside protective film disposed at predetermined intervals in a longitudinal direction of the separator; and a support film disposed to be spaced apart from the outside of the dicing tape integrated backside protective film to include both long sides of the separator, wherein:

a thickness of the support film is equal to a thickness of a portion of the dicing tape integrated backside protective film including an adhesive layer;

the support film includes a second adhesive layer in contact with the separator and a second dicing tape formed on the second adhesive layer; and the second dicing tape protrudes toward the dicing tape integrated backside protective film more than the second adhesive layer.

2. The adhesive layer of claim 1, wherein a width of the second adhesive layer toward the dicing tape integrated backside protective film is smaller than a width of the second dicing tape toward the dicing tape integrated backside protective film.

3. The adhesive layer of claim 1, wherein:

the dicing tape integrated backside protective film includes a first adhesive layer in contact with the separator and a first dicing tape formed on the first adhesive layer; and the second adhesive layer of the support film comprises the same material as the first adhesive layer of the dicing tape integrated backside protective film.

4. The adhesive layer of claim 1, wherein:

the dicing tape integrated backside protective film includes a first adhesive layer in contact with the separator and a first dicing tape formed on the first adhesive layer; and the second dicing tape of the support film comprises the same material as the first dicing tape of the dicing tape integrated backside protective film.

5. The adhesive layer of claim 1, wherein the second dicing tape of the support film includes a second pressure sensitive adhesive (PSA) layer and a base layer formed on the second PSA layer, and the second PSA layer is formed on the second adhesive layer.

6. The adhesive layer of claim 1, wherein the support film is disposed in a direction that surrounds a portion or the entire outer perimeter of the dicing tape integrated backside protective film.

7. The adhesive layer of claim 1, further comprising one or more unit bodies including the dicing tape integrated backside protective film and the support film on one surface of the separator.

8. The adhesive layer of claim 1, wherein the adhesive layer is wound in the form of a roll.

* * * * *